US008395052B2

(12) United States Patent  
Ishimatsu et al.

(10) Patent No.: US 8,395,052 B2
(45) Date of Patent: Mar. 12, 2013

(54) CONDUCTIVE PARTICLE, ANISOTROPIC CONDUCTIVE FILM, JOINED STRUCTURE, AND JOINING METHOD

(75) Inventors: Tomoyuki Ishimatsu, Tochigi (JP); Hiroki Ozeki, Tochigi (JP); Hiroshi Hamachi, Tochigi (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 167 days.

(21) Appl. No.: 12/975,421

(22) Filed: Dec. 22, 2010

(65) Prior Publication Data

US 2011/0088935 A1 Apr. 21, 2011

Related U.S. Application Data

(63) Continuation of application No. PCT/JP2009/061176, filed on Jun. 19, 2009.

(30) Foreign Application Priority Data

Jul. 24, 2008 (JP) ................................. 2008-191098

(51) Int. Cl.
*H05K 1/09* (2006.01)

(52) U.S. Cl. ..... 174/257; 174/258; 174/259; 174/126.2; 428/220; 428/327; 428/332; 428/403; 428/447; 257/737; 257/738; 205/74; 523/135; 29/832

(58) Field of Classification Search .......... 174/257–259, 174/126.2; 428/220, 327, 332, 403, 447; 257/737, 738; 205/74; 523/135; 29/832
See application file for complete search history.

(56) References Cited

U.S. PATENT DOCUMENTS 5,116,666 A * 5/1992 Konno .......................... 428/220
5,183,594 A * 2/1993 Yoshinaka et al. ........ 252/519.33
5,618,394 A * 4/1997 Patterson .................... 204/278.5
6,194,484 B1 * 2/2001 Hugo ............................. 523/135
6,300,164 B1 * 10/2001 Call et al. ...................... 438/108
6,322,685 B1 * 11/2001 Kang et al. ................... 205/143
6,352,775 B1 * 3/2002 Sasaki et al. .................. 428/403

(Continued)

FOREIGN PATENT DOCUMENTS

| CN | 1723590 A | 1/2006 |
| CN | 1906705 | 1/2007 |

(Continued)

OTHER PUBLICATIONS

International Search Report (PCT/ISA/210) issued on Aug. 11, 2009, by Japanese Patent Office as the International Searching Authority for International Application No. PCT/JP2009/061176.

(Continued)

*Primary Examiner* — Xiaoliang Chen
(74) *Attorney, Agent, or Firm* — Buchanan Ingersoll & Rooney PC

(57) ABSTRACT

The present invention aims to provide conductive particles which can reduce the stress while maintaining high hardness (hardly causing cracks even in a state of being crushed in connection process) by improving rolling properties and can ensure adequate conductive reliability not only with respect to ITO substrates, but also with respect to IZO substrates, an anisotropic conductive film provided with the conductive particles, a joined structure provided with the anisotropic conductive film, and a joining method using the anisotropic conductive film. The conductive particles of the present invention include polymer fine particles, and a conductive layer formed on surfaces of the polymer fine particles, wherein an outermost surface shell of the conductive layer is a nickel-palladium alloy layer.

16 Claims, 3 Drawing Sheets

U.S. PATENT DOCUMENTS

| | | | |
|---|---|---|---|
| 6,372,376 B1* | 4/2002 | Fronk et al. | 429/487 |
| 6,770,369 B1 | 8/2004 | Oyamada et al. | |
| 2002/0191527 A1* | 12/2002 | Kikukawa et al. | 369/116 |
| 2003/0178313 A1* | 9/2003 | Tanaka et al. | 205/74 |
| 2004/0031690 A1* | 2/2004 | Tanaka et al. | 205/74 |
| 2004/0115340 A1* | 6/2004 | Griego | 427/98 |
| 2005/0057867 A1* | 3/2005 | Harris et al. | 361/56 |
| 2005/0127214 A1* | 6/2005 | Martens et al. | 241/5 |
| 2006/0100314 A1 | 5/2006 | Arifuku et al. | |
| 2006/0257555 A1* | 11/2006 | Brady et al. | 427/115 |
| 2006/0286369 A1* | 12/2006 | Tanaka et al. | 428/332 |
| 2007/0092698 A1 | 4/2007 | Ishida et al. | |
| 2007/0139848 A1* | 6/2007 | Harris et al. | 361/118 |
| 2007/0145585 A1* | 6/2007 | Jun et al. | 257/737 |
| 2007/0298267 A1* | 12/2007 | Zhong et al. | 428/447 |
| 2008/0102277 A1* | 5/2008 | Bae et al. | 428/403 |
| 2008/0152957 A1* | 6/2008 | James et al. | 429/12 |
| 2008/0157361 A1* | 7/2008 | Wood et al. | 257/738 |
| 2008/0254548 A1* | 10/2008 | Bamdad et al. | 436/94 |
| 2008/0274349 A1* | 11/2008 | Chiu et al. | 428/327 |
| 2009/0070994 A1* | 3/2009 | Miyakawa et al. | 29/832 |
| 2009/0130339 A1* | 5/2009 | Son et al. | 427/601 |
| 2009/0136719 A1* | 5/2009 | Kawamura et al. | 428/195.1 |
| 2009/0321116 A1 | 12/2009 | Arifuku et al. | |
| 2010/0018288 A1* | 1/2010 | Yamanaka et al. | 73/24.02 |
| 2010/0025089 A1* | 2/2010 | Taketatsu et al. | 174/257 |
| 2010/0043635 A1* | 2/2010 | Gueret et al. | 95/96 |
| 2010/0113264 A1* | 5/2010 | Tsurumi et al. | 502/402 |
| 2010/0143665 A1* | 6/2010 | Ogawa | 428/195.1 |
| 2010/0170626 A1* | 7/2010 | Lochtman et al. | 156/150 |
| 2011/0176288 A1* | 7/2011 | Katogi et al. | 361/820 |
| 2011/0247757 A1 | 10/2011 | Arifuku et al. | |
| 2011/0247870 A1 | 10/2011 | Arifuku et al. | |

FOREIGN PATENT DOCUMENTS

| | | |
|---|---|---|
| JP | 6-052715 A | 2/1994 |
| JP | 2000-243132 A | 9/2000 |
| JP | 2002-025345 A | 1/2002 |
| JP | 2004-014409 A | 1/2004 |
| JP | 2005-166438 A | 6/2005 |
| JP | 2007-035573 A | 2/2007 |
| JP | 2007-324138 A | 12/2007 |
| TW | 442802 | 6/2001 |
| TW | 200420707 | 10/2004 |
| WO | WO 2005/002002 A1 | 1/2005 |

OTHER PUBLICATIONS

Written Opinion (PCT/ISA/237) issued on Aug. 11, 2009, by Japanese Patent Office as the International Searching Authority for International Application No. PCT/JP2009/061176.

International Preliminary Report on Patentability (PCT/IPEA/409) issued on Jun. 14, 2010, by Japanese Patent Office as the International Searching Authority for International Application No. PCT/JP2009/061176.

Office Action dated Dec. 16, 2011, issued in the corresponding Chinese Patent Application No. 200980123234.2, and an English Translation thereof. (12 pages).

Office Action issued in corresponding Taiwanese Application No. 098124576 dated Sep. 7, 2012.

* cited by examiner

CONDUCTIVE PARTICLE, ANISOTROPIC CONDUCTIVE FILM, JOINED STRUCTURE, AND JOINING METHOD

CROSS-REFERENCE TO RELATED APPLICATION

This is a continuation of Application No. PCT/JP2009/061176, filed on Jun. 19, 2009.

BACKGROUND OF THE INVENTION

1. Field of the Invention

The present invention relates to a conductive particle, an anisotropic concoctive film, a joined structure, and a joining method.

2. Background of the Invention

To connect circuit members each other, such as a connection between a liquid crystal display device and a tape carrier package (TCP), a connection between a flexible printed circuit (FPC) and a printed circuit board, or a connection between a FPC and a printed circuit board, a circuit connecting material (e.g., anisotropic conductive adhesive), in which conductive particles are dispersed in an adhesive, is used. In recent years, when a semiconductor silicon chip is mounted on a substrate, in order to connect circuit members to each, so-called "flip chip mounting" is employed in which the semiconductor silicon chip is directly bonded face down on the substrate without using a wire bond. In this flip chip mounting, circuit connecting materials, such as an anisotropic conductive adhesive, are used for connecting circuit members to each other.

The above-mentioned circuit connecting material typically contain an adhesive composition and conductive particles. Examples of the conductive particles include (1) conductive particles containing, on surfaces of nickel particles, at least one kind selected from Au, Ag and Pd, via an alloy layer (for example, Japanese Patent Application Laid-Open (JP-A) No. 2002-25345); (2) conductive particles which include a core made of an organic polymer, a metal layer which is formed on the core and made of copper, nickel, a nickel alloy, silver or a silver alloy, and an outermost surface layer made of gold or palladium (for example, International Publication No. WO2005/002002); (3) conductive particles which include a core made of an organic polymer, a metal layer which is formed on the core and made of copper, nickel, a nickel alloy, silver or a silver alloy, an outermost surface layer made of gold or palladium, and protruded portions provided on the front surface side of the outermost surface layer, having a height of 50 nm to 500 nm and composed of nickel, copper, gold, cobalt or the like (for example, Japanese Patent Application Laid-Open (JP-A) No. 2005-166438); and (4) conductive particles resin fine particles, and a conductive layer formed on surfaces of the resin fine particles and made of nickel, wherein the conductive layer having, on its surface, protrusions containing at least one metal or a metal oxide selected from the group consisting of gold, silver, copper, palladium, zinc, cobalt and titanium, as a core material (for example, Japanese Patent Application Laid-Open (JP-A) No. 2007-35573). Here, in order to properties of the conductive particles to the maximum extent possible, it is the most preferable to compress conductive particles to 40% to 70% to the original volume prior to being used for connecting. Note that provision of the protrusions on the surfaces of conductive particles is preferred for an inactive metal which is hard and does not have surface oxidation properties to be connected with low resistance.

However, in the case where nickel is used as an outermost shell of conductive particles, there is a problem that the surface of nickel is easily oxidized and thus a low resistance cannot be obtained.

In the case where palladium is used as an outermost shell of conductive particles, when the conductive particles are compressed to an appropriate extent prior to being used, there is a problem that the rise in resistance after environmental reliability test is further increased due to plating cracking.

Further, in the case where cobalt, which is higher in Mohs hardness than palladium, is used as an outermost shell of conductive particles, there are problems that cobalt is highly surface active and easily oxidized, and when used in combination with a radically polymerizable binder, a catalyst action is caused, which leads to a significant degradation in the storage stability.

In addition, recently, IZO (indium zinc oxide) tends to be used in place of ITO (indium tin oxide), which increases production cost.

In the case where gold which has high conductivity is used as an outermost shell of conductive particles, the conductive reliability can be ensured with respect to an ITO substrate, which has been conventionally used as an electrode material, but with respect to an IZO substrate having a metal oxide (nonconductor) formed on its surface and thus having a smooth surface, the gold broke through the metal oxide (nonconductor), it is impossible to make the metal oxide bite into the gold, and thus adequate conductive reliability cannot be ensured.

At the present time, conductive particles which can reduce the stress while maintaining high hardness (hardly causing cracks even in a state of being crushed in connection process) and can ensure adequate conductive reliability not only with respect to ITO substrates, but also with respect to IZO substrates have not yet been found out.

BRIEF SUMMARY OF THE INVENTION

The present invention aims to solve the above conventional problems and to achieve the following object. Namely, an object of the present invention is to provide conductive particles which can reduce the stress while maintaining high hardness (hardly causing cracks even in a state of being crushed in connection process) by improving rolling properties and can ensure adequate conductive reliability not only with respect to ITO substrates, but also with respect to IZO substrates, an anisotropic conductive film provided with the conductive particles, a joined structure provided with the anisotropic conductive film, and a joining method using the anisotropic conductive film.

Means for solving the above problems are as follows:

<1> Conductive particles including:
polymer fine particles, and
a conductive layer formed on surfaces of the polymer fine particles,
wherein an outermost surface shell of the conductive layer is a nickel-palladium alloy layer.

In the conductive particles, the outermost surface shell of the conductive layer is a nickel-palladium alloy layer, and thus it can reduce the stress while maintaining high hardness (hardly causing cracks even in a state of being crushed in connection process) and can ensure adequate conductive reliability not only with respect to ITO substrates, but also with respect to IZO substrates <2> The conductive particles according to <1> above, wherein the nickel-palladium alloy layer has a thickness of 5 nm to 20 nm.

<3> The conductive particles according to one of <1> and <2> above, wherein the nickel-palladium alloy layer is formed by carrying a palladium catalyst on the surfaces of the polymer fine particles and using a catalyst promoter.

<4> The conductive particles according to any one of <1> to <3> above, wherein the conductive layer includes a nickel plating layer which is formed on the surfaces of the polymer fine particles.

<5> The conductive particles according to any one of <1> to <4> above, wherein the conductive layer has a thickness of 50 nm to 150 nm.

<6> The conductive particles according to any one of <1> to <5> above, wherein a compressive elasticity modulus of the conductive particles at a compression deformation rate of 40% to 70% is 100 kgf/mm$^2$ to 1,000 kgf/mm$^2$, and a compression deformation recovery rate is 10% to 70%.

<7> The conductive particles according to any one of <1> to <6> above, further including: protrusions each having a core made of at least any one of nickel, palladium, cobalt, and chromium.

<8> The conductive particles according to any one of <1> to <7> above, wherein the conductive particles are used for connecting an IZO substrate.

<9> Anisotropic conductive film including:
the conductive particles according to any one of <1> to <8> above, and
a binder,
wherein the binder contains at least one of an epoxy resin and an acrylate resin.

<10> The anisotropic conductive film according to <9> above, further including: at least one of a phenoxy resin, an unsaturated polyester resin, a saturated polyester resin and a urethane resin in an amount of 10% by mass to 80% by mass relative to the total amount of the anisotropic conductive film.

<11> The anisotropic conductive film according to <10> above, further including: a latent curing agent which is activated under heating.

<12> The anisotropic conductive film according to <10> above, further including: a latent curing agent which generates free radicals under heating.

<13> The anisotropic conductive film according to any one of <9> to <12> above, wherein when a curing rate of the anisotropic conductive film is 80% or higher, an elastic modulus thereof at a temperature of 40° C. or lower is 0.5 GPa or more, and a glass transition temperature thereof is 50° C. or higher.

<14> A joined structure including:
a first circuit member,
a second circuit member disposed facing to the first circuit member, and
the anisotropic conductive film according to any one of <9> to <13> disposed between the first circuit member and the second circuit member,
wherein an electrode in the first circuit member is connected to an electrode in the second circuit member via the conductive particles.

<15> The joined structure according to <14> above, wherein at least one of the first circuit member and the second circuit member is an IZO substrate.

<16> A joining method using the anisotropic conductive film according to any one of <9> to <13> above, including:
disposing the anisotropic conductive film between a first circuit member and a second circuit member,
pressing the first circuit member against the second circuit member, and
connecting an electrode in the first circuit member to an electrode in the second circuit member via the conductive particles.

<17> The joining method according to <16> above, wherein at least one of the first circuit member and the second circuit member is an IZO substrate.

The present invention can solve the above conventional problems and provide conductive particles which can reduce the stress while maintaining high hardness (hardly causing cracks even in a state of being crushed in connection process) by improving rolling properties and can ensure adequate conductive reliability not only with respect to ITO substrates, but also with respect to IZO substrates, an anisotropic conductive film provided with the conductive particles, a joined structure provided with the anisotropic conductive film, and a joining method using the anisotropic conductive film.

Figure 1:
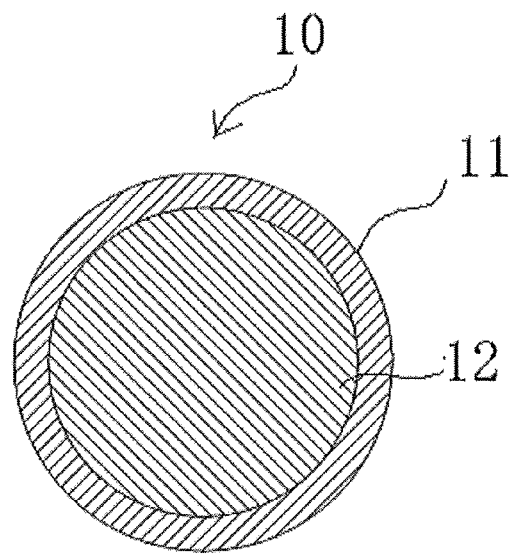
FIG. 1 is a cross-sectional view of conductive fine particles according to the present invention (first).

DETAILED DESCRIPTION OF THE INVENTION (Conductive Particle)

Conductive particles according to the present invention include at least polymer fine particles and a conductive layer and, if necessary, further include protrusions.

Also, the conductive particles preferably has a compressive elasticity modulus at a compression deformation rate of 40% to 70% of 100 kgf/mm$^2$ to 1,000 kgf/mm$^2$, and a compression deformation recovery rate be 10% to 70%, and thus preferably used not only for connection of ITO (indium tin oxide) substrates but also for IZO (indium zinc oxide) substrates.

Here, when the compressive elasticity modulus of the conductive particles at a compression deformation rate of 40% to 70% is smaller than 100 kgf/mm$^2$, the conductive particles are crushed excessively with a weak force, and thus it is difficult to control the pressure applied thereto during connection. In addition, the conductive particles are easily broken up with a small force and do not have their original shape (spherical shape), and thus it is impossible to maintain the connection reliability.

In contrast, when the compressive elasticity modulus of the conductive particles at a compression deformation rate of 40% to 70% is greater than 1,000 kgf/mm$^2$, the conductive particles cannot be crushed because of the excessive hardness, and thus it is impossible to maintain the connection reliability.

—Polymer Fine Particles—

Examples of the organic polymer constituting the polymer fine particles include acrylate resins, styrene resins, benzoguanamine resins, silicone resins and polybutadiene resins. The organic polymer may be a copolymer having a structure in which at least two kinds of repeating units based on monomers constituting the above-mentioned resin are arbitrarily combined, however, it is preferably a copolymer obtained by copolymerization of at least two kinds of repeating units selected from the group consisting of benzoguanamine, acrylic acid ester, diallylphthalate, tetramethylolmethane tetraacrylate, divinylbenzene and styrene, and more preferably a copolymer obtained by copolymerization of a combination of tetramethylolmethane tetraacrylate, divinylbenzene and styrene.

Among these, benzoguanamine and the like have a stiff structure in the molecule and have a short distance between crosslinking points, and thus the higher the amount of such molecules contained in the copolymer, the harder conductive particles obtained. It is also possible to obtain such hard conductive particles by increasing the degree of crosslinking of the organic polymer.

Meanwhile, acrylic acid ester, diallylphthalate and the like have a long distance between crosslinking points, and thus the higher the compound of repeating units based on such molecule in the copolymer, the softer conductive particles obtained. It is also possible to obtain such soft conductive particles by decreasing the degree of crosslinking of the organic polymer.

—Conductive Layer—

The conductive layer is not particularly limited, as long as it is formed on surfaces of polymer fine particles and the outermost surface shell thereof is a nickel-palladium alloy layer, and may be suitably selected in accordance with the intended use. However, the one having a nickel-palladium alloy layer on surfaces of the polymer fine particles is preferable. The thickness of the conductive layer is preferably 50 nm to 150 nm.

When the thickness of the conductive layer is made to be less than 50 nm, it is difficult to obtain sufficient electrical properties after completing the connection process.

When the thickness of the conductive layer is made to be more than 150 nm, a large amount of aggregate particles occur, and the short circuit occurrence rate unfavorably increases.

—Nickel-Palladium Alloy Layer—

The nickel-palladium alloy layer is not particularly limited and may be suitably selected in accordance with the intended use. However, the thickness thereof is preferably 3 nm to 150 nm, and more preferably 5 nm to 20 nm.

In addition, the thickness of the nickel-palladium alloy layer is preferably as uniform as possible. When the thickness of the nickel-palladium alloy layer is made to be less than 3 nm, portions not plated with the nickel-palladium alloy layer unfavorably take place. When the thickness of the nickel-palladium alloy layer is made to be more than 150 nm, unfavorably, the amount of particles sticking to each other and aggregating increases.

Here, as a method of measuring the thickness of the nickel-palladium alloy layer, first, conductive particles are dispersed in an epoxy adhesive, and the particles are cut along cross-sections thereof by a grinding machine (manufactured by Marumoto Struers K.K.), and then the thickness thereof is measured by a SEM (manufactured by KEYENCE Corporation, Product No. VE-8800).

The nickel-palladium alloy layer is formed, for example, by carrying a palladium catalyst on surfaces of the polymer fine particles and using a catalyst promoter (e.g., MK-370 (produced by Muromachi Technos Co., Ltd.)).

The nickel-palladium alloy layer is formed by electroless plating, and one of displacement plating utilizing a difference in difference in ionization tendencies and chemical reduction plating using a reducing agent can be also employed.

An alloy ratio of nickel and palladium in the nickel-palladium alloy layer can be arbitrarily designed by varying the formulation ratio of metal salts, in consideration of the degree of hardness, conductivity and a difference in the ionization tendencies depending on the type of the base materials (the first circuit member and the second circuit member) to be connected.

—Nickel Plated Layer—

The nickel plated layer is not particularly limited and may be suitably selected in accordance with the intended use. However, the thickness thereof is preferably 30 nm to 150 nm, and more preferably 30 nm to 147 nm.

When the thickness of the nickel plated layer is made to be less than 30 nm, the adhesiveness with the polymer fine particles degrades, and the nickel plated layer is easily peeled off. When the thickness of the nickel plated layer is made to be more than 150 nm, a large number of aggregates occur, and the short circuit occurrence rate unfavorably increases.

—Protrusions—

The protrusions are not particularly limited and may be suitably selected in accordance with the intended use. For example, those having a core composed of at least one selected from nickel, palladium, cobalt and chromium are exemplified.

—Compressive Elasticity Modulus—

The compressive elasticity modulus (K value (kgf/mm$^2$)) can be measured by a micro-compression tester (PCT-200, manufactured by Shimadzu Corporation) under an atmosphere of 20° C. and determined based on the following equation.

$$K=(3/\sqrt{2}) \cdot F \cdot S^{-3/2} \cdot R^{-1/2}$$

F: Each load value (N) under 40% to 70% compression deformation of conductive particles
S: Each compression displacement (mm) under 40% to 70% compression deformation
R: Radius (mm) of conductive particles —Compression Deformation Recovery Rate—

The compression deformation recovery rate is a value obtained by measuring a relationship between a load value and a compression displacement when the conductive particles are compressed to a reverse load value of 9.8 mN using a micro-compression tester and then the load applied thereto is reversely reduced. More specifically, the compression deformation recovery rate is measured at an end point during removing the load based on the definition that a start load value is 0.98 mN, and a compression speed during application of load or during removing the load is 0.2842 mN/sec, and a ratio (L2/L1) between a displacement (L1) observed to the reversal point and a displacement (L2) from the reversal point to the point of reaching the start load value.

The compression deformation recovery rate can be only a few percent, however, when it is lower than 10%, the conductive particles cannot follow loosening of the binder caused by thermal variations during connection and environmental variations when used, and thus it is impossible to maintain the connection reliability. In contrast, when the compression deformation recovery rate is higher than 70%, a repulsion force greater than the loosening of the binder caused by the thermal variations and environmental variations is produced, unfavorably causing degradation in the connection reliability.

Figure 2:
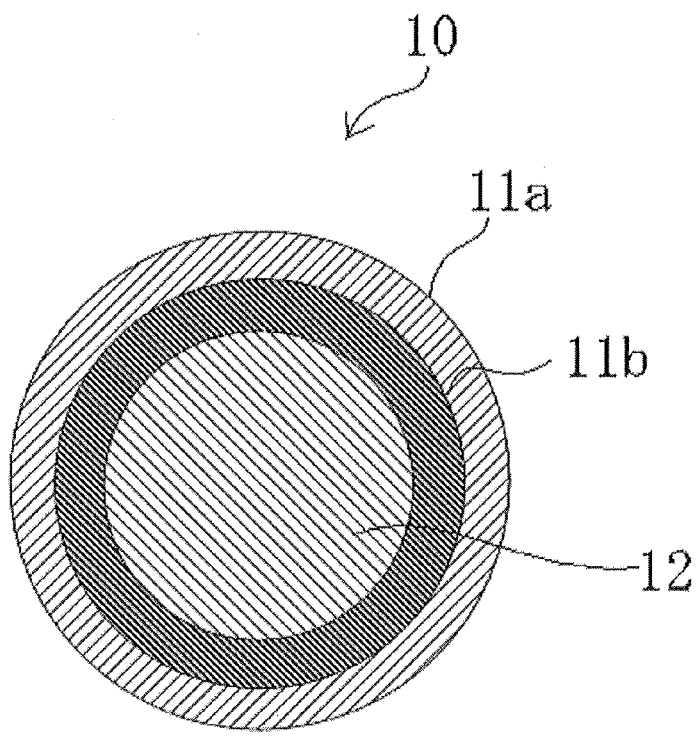
FIG. 2 is a cross-sectional view of conductive fine particles according to the present invention (second).
Figure 3:
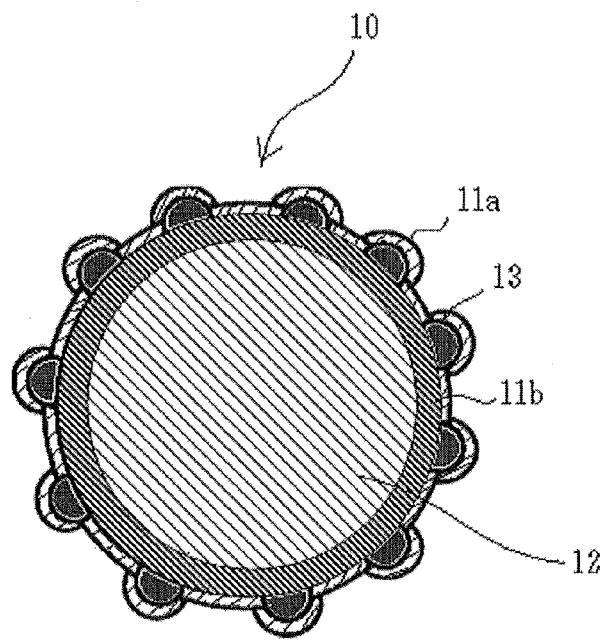
FIG. 3 is a cross-sectional view of conductive fine particles according to the present invention (third).
Figure 4:
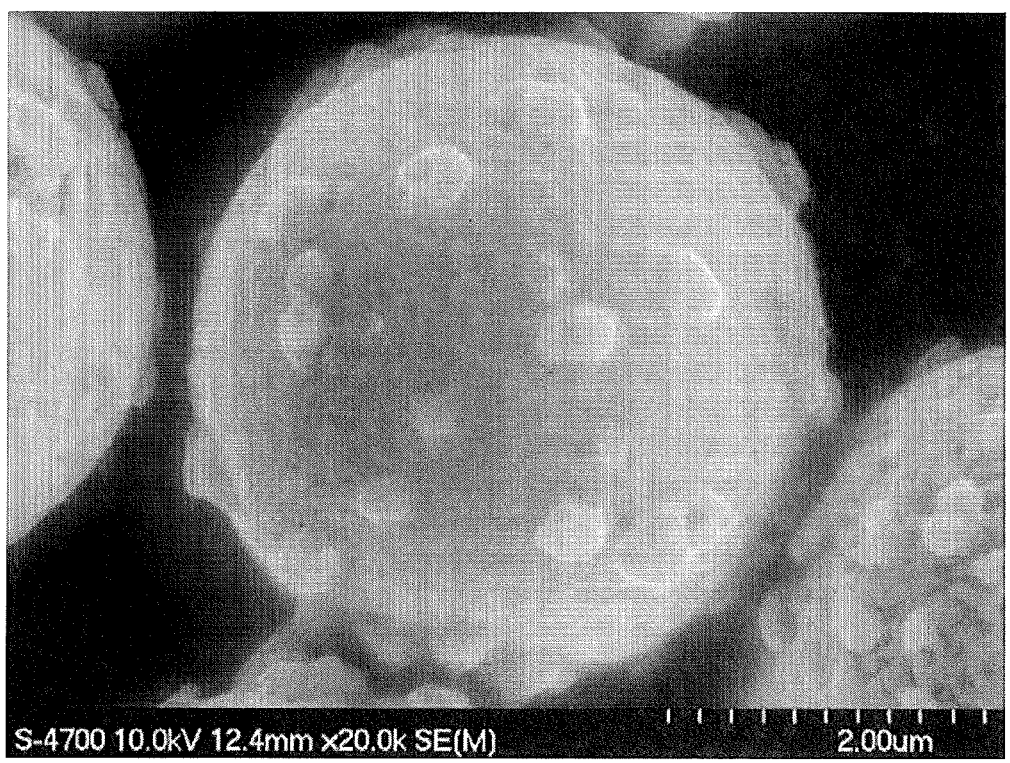
FIG. 4 is a SEM image of conductive fine particles (having protrusions) according to the present invention.

Hereinbelow, the conductive particles of the present invention will be described with reference to FIGS. 1 to 3. As a conductive particle 10, there may be exemplified (1) a conductive particle including a polymer fine particle 12 and a conductive layer 11 which is formed on the surface of the polymer fine particle 12 and composed of a nickel-palladium alloy layer (FIG. 1); (2) a conductive particle including a polymer fine particle 12, and a conductive layer 11 which is composed of a nickel layer 11b formed on the surface of the polymer fine particle 12 and a nickel-palladium alloy layer 11a formed on the surface of the nickel layer 11b (FIG. 2); and (3) a conductive particle further including protrusions 13 (FIGS. 3 and 4) are exemplified.

(Anisotropic Conductive Film)

An anisotropic conductive film according to the present invention includes at least the conductive particles of the present invention and a binder, and, if necessary, further includes a latent curing agent, and a resin which is solid at normal temperature.

Generally, in an anisotropic conductive film, high connection reliability can be obtained by deforming conductive particles 40% to 70% before used in connection.

When a curing rate of the anisotropic conductive film is 80% or higher, the elastic modulus thereof at a temperature of 40° C. or lower is preferably 0.5 GPa or more, and the glass transition temperature thereof is preferably 50° C. or higher.

When the elastic modulus is less than 0.5 GPa, it is impossible to bully the conductive particles, which are sandwiched between terminals and deformed, into the anisotropic conductive film, resulting in an increase in the resistance value and degradation of the connection reliability. When the glass transition temperature of the anisotropic conductive film is lower than 50° C., it may be softened by heat etc. generated during driving of electronic components, and thus it is impossible to bully the conductive particles into the anisotropic conductive film, causing connection failure.

—Binder—

The binder is not particularly limited, as long as it is at least one of an epoxy resin and an acrylate resin, and may be suitably selected in accordance with the intended use.

—Epoxy Resin—

The epoxy resin is not particularly limited and may be suitably selected in accordance with the intended use. Examples thereof include bisphenol A type epoxy resins, bisphenol F type epoxy resins, and novolac type epoxy resins. These may be used alone or in combination.

—Acrylate Resin—

The acrylate resin is not particularly limited and may be suitably selected in accordance with the intended use. Examples thereof include methyl acrylate, ethyl acrylate, isopropyl acrylate, isobutyl acrylate, epoxy acrylate, ethylene glycol diacrylate, diethylene glycol diacrylate, trimethylolpropane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)propane, dicyclopentenyl acrylate, tricyclodecanyl acrylate, tris(acryloxyethyl)isocyanurate, and urethane acrylate. These may be used alone or in combination.

In addition, resins obtained by methacrylation of the acrylates are also exemplified. These may be used alone or in combination.

—Latent Curing Agent—

The latent curing agent is not particularly limited and may be suitably selected in accordance with the intended use. Examples thereof include latent curing agents activated by heating, and latent curing agents generating free radicals.

The latent curing agents activated by heating are not particularly limited and may be suitably selected in accordance with the intended use. Examples thereof include anionic curing agents (e.g., polyamine, and imidazole), and cationic curing agents (e.g., sulfonium salts).

The latent curing agents generating free radicals are not particularly limited and may be suitably selected in accordance with the intended use. Examples thereof include organic peroxides and azo compounds.

—Resin which is Solid at Normal Temperature—

Examples of the resin which is solid at normal temperature include phenoxy resins, unsaturated polyester resins, saturated polyester resins, and urethane resins. The resin is preferably contained in an amount of 10% by mass to 80% by mass based on the anisotropic conductive film.

When the resin is contained less than 10% by mass based on the anisotropic conductive film, the anisotropic conductive film lacks in film properties, and when it is formed in a reel-shaped product, blocking phenomenon is caused. When the resin is contained more than 80% by mass based on the anisotropic conductive film, the tackiness of the film degrades and the film cannot be attached to circuit members.

(Joined Structure)

The joined structure of the present invention includes a first circuit member, a second circuit member disposed facing the first circuit member, and an anisotropic conductive film disposed between the first circuit member and the second circuit member, wherein an electrode in the first circuit member is connected to an electrode in the second circuit member via the conductive particles.

—First Circuit Member—

The first circuit member is not particularly limited and may be suitably selected in accordance with the intended use. Examples thereof include an FPC substrate and a PWB substrate.

—Second Circuit Member—

The second circuit member is not particularly limited and may be suitably selected in accordance with the intended use. Examples thereof include FPC substrates, COF substrates, TCP substrates, PWB substrates, IC substrates, and panels.

At least one of the first circuit member and the second circuit member is preferably an IZO (indium zinc oxide) substrate (a substrate on which an IZO interconnection is formed).

In an IZO interconnection, film formation can be performed over a wide temperature range (from room temperature to 350° C.), and an amorphous film can be stably formed.

Figure 5:
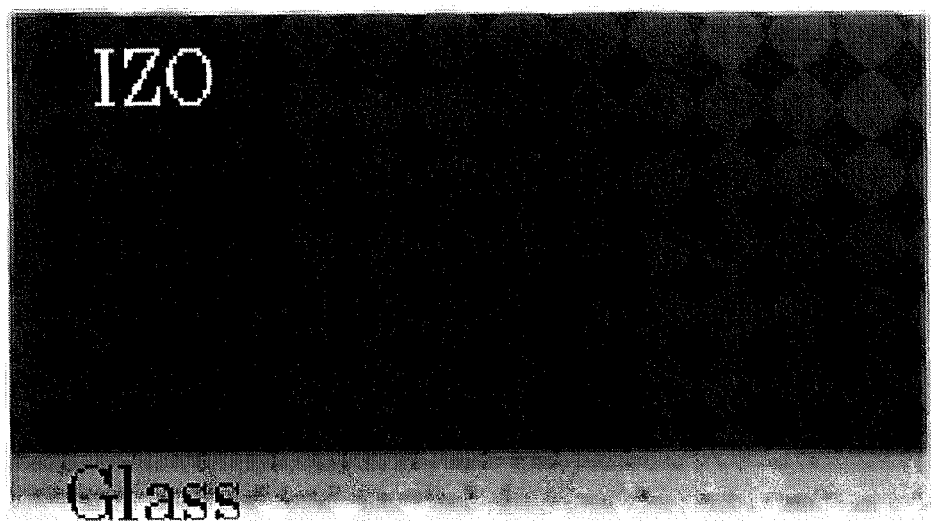
FIG. 5 is a TEM image of a cross section of an IZO interconnection.
Figure 6:
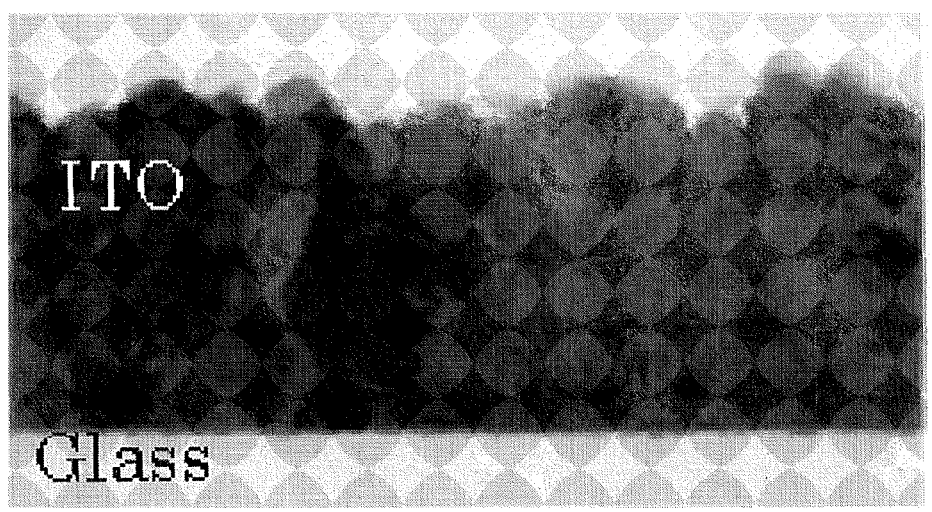
FIG. 6 is a TEM image of a cross section of an ITO interconnection.

Therefore, IZO interconnection enables forming a film having a smoother surface than that in ITO interconnection as illustrated in FIGS. 5 and 6, and enables obtaining uniform and high conductivity in the formed film. In addition, not only impact on a glass substrate is reduced, but also the process steps can be simplified, and thus low-cost production is possible.

Also, from FIGS. 5 and 6, it is clear that IZO interconnection is amorphous and has a smooth surface, but ITO interconnection is crystalline and has high surface roughness.

IZO interconnection has an amorphous structure in which there are a large number of series of indium oxide-octahedral structures each having shared ridges, and this is considered to be the cause of its excellent conductivity.

(Joining Method)

The joining method of the present invention includes at least a disposing step, a pressing step and a connecting step, and further includes other steps suitably selected as required.

—Disposing Step—

The disposing step is a step of disposing an anisotropic conductive film according to the present invention between a first circuit member and a second circuit member.

At least one of the first circuit member and the second circuit member is preferably an IZO (indium zinc oxide) substrate.

—Pressing Step—

The pressing step is a step of pressing the first circuit member against the second circuit member.

—Connecting Step—

The connecting step is a step of connecting an electrode in the first circuit member to an electrode in the second circuit member via the conductive particles.

—Other Steps—

The other steps are not particularly limited and may be suitably selected in accordance with the intended use.

EXAMPLES

Hereinafter, Examples of the present invention will be described, however, these examples shall not be construed as limiting the scope of the present invention in any way.

Comparative Example 1

Production of Conductive Particle A1

—Production of Base Material Particles (Resin Particles)—

In a mixture solution containing divinylbenzene, a styrene monomer and butyl methacrylate, benzoyl peroxide as a polymerization initiator was added, and the mixture solution was subjected to a polymerization reaction by heating while being uniformly stirred at high speed, to thereby obtain a fine particle dispersion liquid. This fine particle dispersion liquid was filtered and then dried under reduced pressure to obtain a block (aggregates of fine particles). Further, this block was pulverized, thereby producing base material particles (resin particles) having different crosslinking densities and an average particle diameter of 3.8 μm.

—Nickel Plating—

On surfaces of the resin particles produced above, a palladium catalyst (produced by Muromachi Technos Co., Ltd., trade name: MK-2605) was carried, and the resin particles activated with a catalyst promoter (produced by Muromachi Technos Co., Ltd., trade name: MK-370) were charged into a mixture liquid heated at 60° C. and containing a nickel sulfate aqueous solution, a sodium hypophosphite aqueous solution and a sodium tartrate aqueous solution to perform a pre-electroless plating treatment. The reaction mixture was stirred for 20 minutes, and then it was confirmed that foaming of hydrogen was stopped. Next, a mixture solution containing nickel sulfate, sodium hypophosphite, sodium citrate and a plating stabilizer was added to the reaction mixture, and stirred until the pH thereof was stabilized, followed by a post-electroless plating treatment until foaming of hydrogen was stopped. Subsequently, the plating liquid thus obtained was filtered, and the filtered product was washed with water, followed by drying in a vacuum drier heated at 80° C., thereby forming nickel-plated conductive particles.

—Gold Plating—

Into a mixture solution of sodium chloroaurate and ion exchanged water, the nickel-plated conductive particles were charged, and then ammonium thiosulfate, ammonium sulfite and ammonium hydrogenphosphate were charged thereto to prepare a plating liquid. Into the thus obtained plating liquid, hydroxylamine was added, and then the pH was adjusted to 10. The bath temperature was adjusted to 65° C., and the plating liquid was subjected to a reaction for about 20 minutes, thereby producing Conductive Particle A1 having an outermost surface shell plated with gold (the outermost surface layer was a gold layer).

<Evaluation of Conductive Particle A1>

—Measurement of Compressive Elasticity Modulus (K Value) and Compression Deformation Recovery Rate—

Using a micro-compression tester (PCT-200, manufactured by Shimadzu Corporation), Conductive Particle A1 was measured for its compressive elasticity modulus (K value) and compression deformation recovery rate at a compression deformation rate of 50%. The measurement was carried out under an atmosphere of 20° C. As to the compressive elasticity modulus, values measured under each compression rate and at a compression speed of 0.2 gf/sec were read. As to the compression deformation modulus, it was measured at a compression speed of 0.2 gf/sec and under a load applied at the start point of 0.1 gf and a reverse load value of 1.0 gf. The measurement results are shown in Table 1.

—Measurement of Plated Thickness—

The produced Conductive Particle A1 was dispersed in an epoxy adhesive and cured, and cut along cross-sections by a grinding machine (manufactured by Marumoto Struers K.K.), and then the thickness thereof was measured by a SEM (manufactured by KEYENCE Corporation, Product No. VE-8800). The measurement results are shown in Table 1.

<Production of Anisotropic Conductive Film>

The produced Conductive Particle A1 was dispersed in a microcapsule type amine-based curing agent, as a thermocurable binder (produced by Asahi Chemical Industry Co., Ltd., trade name: NOVACURE HX3941HP) (50 parts), a liquid epoxy resin (produced by Japan Epoxy Resin Co., Ltd., trade name: EP828) (14 parts), a phenoxy resin (produced by Toto Kasei Co., Ltd., trade name: YP50) (35 parts), a silane coupling agent (produced by Shin-Etsu Chemical Co., Ltd., trade name: KBE403) (1 part) so as to achieve a volume ratio of 10%, and the dispersion liquid was applied onto a release PET film having a surface treated with silicon so as to have a thickness of 20 μm, to thereby produce a sheet-shaped anisotropic conductive film.

<Production of IZO Interconnection-Packaged Structure (Joined Structure) A1>

An IZO interconnection-joined structure A1 was produced. As base materials for evaluation, COF (produced by SONY CHEMICAL & INFORMATION DEVICE CORPORATION, COF for evaluation, 50 μmP, Cu 8 μmt-Sn plating, 38 μmt-S' perflex base material) and an IZO solid glass (produced by SONY CHEMICAL & INFORMATION DEVICE CORPORATION, ITO solid glass for evaluation, IZO-plated thickness: 300 nm, glass thickness: 0.7 mm) were used, and connected as follows. First, to the IZO solid glass, the anisotropic conductive film that had been slit in 1.5 mm width was temporarily attached using a pressure-bonding device (tool width: 1.5 mm, cushioning material: 70 μm-thickness Teflon (registered), under temporary pressure-bonding conditions of 80° C.-1 MPa-2 sec, and the release PET film was peeled off therefrom. Subsequently, the COF was temporarily fixed by the same pressure-bonding device under temporary fixing conditions of 80° C.-0.5 MPa-0.5 sec. Finally, for a real pressure-bonding treatment, using the pressure-bonding device (tool width: 1.5 mm, cushioning material: 70 μm-thickness Teflon (registered), the COF was pressure-bonded to the IZO solid glass under conditions of 190° C.-3 MPa-10 sec., to thereby produce an IZO interconnection-packaged structure (joined structure).

<Production of ITO Interconnection-Packaged Structure A1>

An ITO interconnection-packaged structure A1 was produced in the same manner as in the production of the IZO interconnection-packaged structure A1, except that the IZO solid glass was changed to an ITO solid glass (produced by SONY CHEMICAL & INFORMATION DEVICE CORPO- RATION, ITO solid glass for evaluation, ITO-plated thickness: 300 nm, glass thickness: 0.7 mm).

<Measurement of Connection Resistance of Packaged Structure A1>

The thus produced IZO interconnection-packaged structure A1 and ITO interconnection-packaged structure A1 were measured for connection resistance when an electrical current (1 mA) was passed therethrough by a four-terminal method. The measurement results are shown in Table 2.

Comparative Example 2

Production of Conductive Particle A2, evaluation of Conductive Particle A2, production of an anisotropic conductive film, production of an IZO interconnection-packaged structure A2, production of an ITO interconnection-packaged structure A2, and measurement of connection resistance of these packaged structures A2 were carried out in the same manner as in Comparative Example 1, except that the following palladium plating was performed instead of performing gold plating. The results are shown in Tables 1 and 2.

<Palladium-Plating>

Into a mixture solution containing tetrachloropalladium, ethylene diamine, amino pyridine, sodium hypophosphite, polyethylene glycol and ion exchanged water, the nickel-plated conductive particles were added and mixed. Then, the pH of the mixed solution was adjusted to 7.5 and reacted at a bath temperature of 60° C. for about 20 minutes, thereby producing Conductive Particle A2 having a palladium-plated outermost surface layer.

Example 1

A palladium catalyst (produced by Muromachi Technos Co., Ltd., trade name: MK-2605) was carried on the surface of the resin particles produced in Comparative Example 1, and then activated by a catalyst promoter (produced by Muromachi Technos Co., Ltd., trade name: MK-370). The thus activated resin particles were charged into a mixture solution containing palladium chloride, nickel chloride, ethylene diamine, thiodiglycolic acid and sodium hypophosphite, the pH of the mixed solution had been adjusted with ammonia at a bath temperature of 60° C. so as to be 8, thereby producing Conductive Particle A3 having a nickel-palladium alloy-plated outermost surface shell (the outermost surface layer was a nickel-palladium alloy layer). Further, evaluation of Conductive Particle A3, production of an anisotropic conductive film, production of an IZO interconnection-packaged structure A3, production of an ITO interconnection-packaged structure A3, and measurement of connection resistance of these packaged structures A3 were carried out in the same manner as in Comparative Example 1. The results are shown in Tables 1 and 2.

Example 2

Production of Conductive Particle A4, evaluation of Conductive Particle A4, production of an anisotropic conductive film, production of an IZO interconnection-packaged structure A4, production of an ITO interconnection-packaged structure A4, and measurement of connection resistance of these packaged structures A4 were carried out in the same manner as in Comparative Example 1, except that the following nickel-palladium alloy plating was performed instead of performing gold plating. The results are shown in Tables 1 and 2.

<Nickel-Palladium Alloy Plating>

Into a mixture solution containing palladium chloride, nickel chloride, ethylene diamine, thiodiglycolic acid and sodium hypophosphite, the nickel-plated conductive particles were added and mixed. Then, the pH of the mixed solution was adjusted to 8 and reacted at a bath temperature of 60° C., thereby producing Conductive Particle A4 having a nickel-palladium alloy-plated outermost surface shell (the outermost surface layer was a nickel-palladium alloy layer).

Example 3

The resin particles produced in Comparative Example 1 were dispersed in deionized water for 3 minutes, and then a nickel slurry (100 nm) was charged thereto and stirred to obtain base material particles to which surfaces the nickel slurry was attached. In addition, the base material particles were subjected to the same pre-electroless plating treatment and post-electroless plating treatment of nickel plating performed in Comparative Example 1 to produce a conductive particle provided with nickel-made protrusions. The conductive particle was further subjected to the nickel-palladium alloy plating of Example 2, thereby producing Conductive Particle A5. Further, evaluation of Conductive Particle A5, production of an anisotropic conductive film, production of an IZO interconnection-packaged structure A5, production of an ITO interconnection-packaged structure A5, and measurement of connection resistance of these packaged structures A5 were carried out in the same manner as in Comparative Example 1, except that the following palladium plating was performed instead of performing gold plating. The results are shown in Tables 1 and 2.

Examples 4 to 12

Production of Conductive Particles A6 to A14, evaluation of Conductive Particles A6 to A14, production of anisotropic conductive films, production of IZO interconnection-packaged structures A6 to A14, production of ITO interconnection-packaged structures A6 to A14, and measurement of connection resistance of these packaged structures A6 to A14 were carried out in the same manner as in Example 3, except that the mixture ratio of divinyl benzene, styrene monomer and butyl methacrylate was changed so that the resulting conductive particles had the compressive elasticity modulus, compression deformation recovery rate as shown in Table 1. The results are shown in Tables 1 and 2.

Comparative Example 3

Production of Conductive Particle A15, evaluation of Conductive Particle A15, production of an anisotropic conductive film, production of an IZO interconnection-packaged structure A15, production of an ITO interconnection-packaged structure A15, and measurement of connection resistance of these packaged structures A15 were carried out in the same manner as in Example 6, except that nickel chloride used in the nickel-palladium alloy plating was changed to copper sulfate, and the conductive particles were plated with a copper-palladium alloy as the outermost surface shell (the outermost surface layer was a copper-palladium alloy layer). The results are shown in Tables 1 and 2.

Comparative Example 4

Production of Conductive Particle A16, evaluation of Conductive Particle A16, production of an anisotropic conductive film, production of an IZO interconnection-packaged structure A16, production of an ITO interconnection-packaged structure A16, and measurement of connection resistance of these packaged structures A16 were carried out in the same manner as in Example 6, except that nickel chloride used in the nickel-palladium alloy plating was changed to potassium gold cyanide, and the conductive particles were plated with a gold-palladium alloy as the outermost surface shell (the outermost surface layer was a gold-palladium alloy layer). The results are shown in Tables 1 and 2.

of 85° C./85%/500 hr) for ITO interconnection, however, showed high resistivity to the IZO interconnection in the initial stage, and the resistivity after the reliability test (under the conditions of 85° C./85%/500 hr) for IZO interconnection was further increased.

It can be considered that the gold-plated particle of Comparative Example 1 had high resistivity after the reliability test (85° C./85%/500 hr) for IZO interconnection because gold plating is soft and thus it cannot get into the IZO interconnection.

TABLE 1

|  | Conductive fine particle | Type of Plating | | Plating Thickness | | Protrusions | Compression elastic modulus | Compression deformation recovery rate |
| --- | --- | --- | --- | --- | --- | --- | --- | --- |
|  |  | Inner surface layer | Outermost surface layer | Inner surface layer | Outermost surface layer |  |  |  |
| Comp. Ex. 1 | A1 | nickel | gold | 110 nm | 20 nm | Not provided | 550 kgf/mm$^2$ | 45% |
| Comp. Ex. 1 | A2 | nickel | palladium | 110 nm | 20 nm | Not provided | 570 kgf/mm$^2$ | 45% |
| Ex. 1 | A3 | nickel-palladium | — | 150 nm | — | Not provided | 610 kgf/mm$^2$ | 45% |
| Ex. 2 | A4 | nickel | nickel-palladium | 110 nm | 20 nm | Not provided | 550 kgf/mm$^2$ | 45% |
| Ex. 3 | A5 | nickel | nickel-palladium | 110 nm | 5 nm | Provided | 530 kgf/mm$^2$ | 45% |
| Ex. 4 | A6 | nickel | nickel-palladium | 110 nm | 20 nm | Provided | 70 kgf/mm$^2$ | 20% |
| Ex. 5 | A7 | nickel | nickel-palladium | 110 nm | 20 nm | Provided | 100 kgf/mm$^2$ | 25% |
| Ex. 6 | A8 | nickel | nickel-palladium | 110 nm | 20 nm | Provided | 550 kgf/mm$^2$ | 45% |
| Ex. 7 | A9 | nickel | nickel-palladium | 110 nm | 20 nm | Provided | 1,100 kgf/mm$^2$ | 65% |
| Ex. 8 | A10 | nickel | nickel-palladium | 110 nm | 20 nm | Provided | 1,000 kgf/mm$^2$ | 60% |
| Ex. 9 | A11 | nickel | nickel-palladium | 110 nm | 20 nm | Provided | 450 kgf/mm$^2$ | 5% |
| Ex. 10 | A12 | nickel | nickel-palladium | 110 nm | 20 nm | Provided | 450 kgf/mm$^2$ | 10% |
| Ex. 11 | A13 | nickel | nickel-palladium | 110 nm | 20 nm | Provided | 650 kgf/mm$^2$ | 80% |
| Ex. 12 | A14 | nickel | nickel-palladium | 110 nm | 20 nm | Provided | 600 kgf/mm$^2$ | 70% |
| Comp. Ex. 3 | A15 | nickel | copper-palladium | 110 nm | 20 nm | Provided | 550 kgf/mm$^2$ | 45% |
| Comp. Ex. 4 | A16 | nickel | gold-palladium | 110 nm | 20 nm | Provided | 550 kgf/mm$^2$ | 45% |

TABLE 2

|  | Joined structure | Conduction Resistance (Ω) | | | |
| --- | --- | --- | --- | --- | --- |
|  |  | IZO interconnection/ COF connection | | ITO interconnection/ COF connection | |
|  |  | Initial stage | 85° C./ 85%/500 hr | Initial stage | 85° C./ 85%/500 hr |
| Comp. Ex. 1 | A1 | 14.4 | 75.8 | 1.3 | 2.1 |
| Comp. Ex. 1 | A2 | 3.1 | 33.2 | 1.1 | 2.4 |
| Ex. 1 | A3 | 3.1 | 7.8 | 1.1 | 2.1 |
| Ex. 2 | A4 | 3.1 | 5.3 | 1.1 | 2.0 |
| Ex. 3 | A5 | 2.7 | 4.9 | 1.1 | 2.0 |
| Ex. 4 | A6 | 2.8 | 22.2 | 1.1 | 2.3 |
| Ex. 5 | A7 | 2.6 | 9.1 | 1.1 | 2.0 |
| Ex. 6 | A8 | 2.6 | 4.9 | 1.1 | 2.0 |
| Ex. 7 | A9 | 5.6 | 21.6 | 1.2 | 2.3 |
| Ex. 8 | A10 | 3.8 | 8.5 | 1.1 | 2.1 |
| Ex. 9 | A11 | 2.4 | 23.1 | 1.1 | 2.2 |
| Ex. 10 | A12 | 2.4 | 9.8 | 1.1 | 2.1 |
| Ex. 11 | A13 | 2.5 | 20.1 | 1.1 | 2.0 |
| Ex. 12 | A14 | 2.5 | 9.6 | 1.1 | 2.0 |
| Comp. Ex. 3 | A15 | 7.6 | 11.7 | 1.1 | 2.1 |
| Comp. Ex. 4 | A16 | 7.6 | 11.4 | 1.1 | 2.1 |

It was found that the gold-plated particle of Comparative Example 1 showed low resistivity to the ITO interconnection in the initial stage and also showed low resistivity to the ITO interconnection after the reliability test (under the conditions It was found that the palladium plated particle of Comparative Example 2 showed low resistivity to the ITO interconnection in the initial stage and also showed low resistivity to the ITO interconnection after the reliability test (85° C./85%/500 hr) for ITO interconnection, and showed high resistivity to the IZO interconnection after the reliability test (85° C./85%/500 hr) for IZO interconnection, although it showed low resistivity to the IZO interconnection in the initial stage. Further, the palladium plated particle was observed by a SEM to check presence or absence of cracks, and found that a number of plating cracks were caused.

It can be considered that the palladium plated particle of Comparative Example 2 had high resistivity after the reliability test (85° C./85%/500 hr) for IZO interconnection because palladium is hard and brittle and thus such a number of cracks are caused.

It was found that the copper-palladium plated particle of Comparative Example 3 showed low resistivity to the ITO interconnection in the initial stage and also showed low resistivity to the ITO interconnection after the reliability test (85° C./85%/500 hr) for ITO interconnection, however, showed high resistivity to the IZO interconnection in the initial stage, and the resistivity after the reliability test (under the conditions of 85° C./85%/500 hr) for IZO interconnection was further increased.

It was found that the gold-palladium plated particle of Comparative Example 4 showed low resistivity to the ITO interconnection in the initial stage and also showed low resistivity to the ITO interconnection after the reliability test (85° C./85%/500 hr) for ITO interconnection, however, showed high resistivity to the IZO interconnection in the initial stage, and the resistivity after the reliability test (under the conditions of 85° C./85%/500 hr) for IZO interconnection was further increased.

In contrast to the above, any of the nickel-palladium particles of Examples 1 to 3, 5, 6, 8, 10, and 12 showed low resistivity to the ITO interconnection in the initial stage and also showed low resistivity to the ITO interconnection after the reliability test (85° C./85%/500 hr) for ITO interconnection, also to the IZO interconnection in the initial stage and the resistivity after the reliability test (under the conditions of 85° C./85%/500 hr) for IZO interconnection.

From the above-mentioned results, it was found that by providing palladium alloy plating, it is possible to simultaneously achieve both hardness and rolling properties and to make conductive particles have low resistivity to IZO interconnection.

The conductive particle of Example 4 having a low compressive elasticity modulus of 70 kgf/mm$^2$ showed higher resistivity after the reliability test (under the conditions of 85° C./85%/500 hr) for IZO interconnection to those of the conductive particles of Examples 1 to 3, 5, 6, 8, 10, and 12.

The conductive particle of Example 7 having a high compressive elasticity modulus of 1,100 kgf/mm$^2$ showed higher resistivity to IZO interconnection in the initial stage to those of the conductive particles of Examples 1 to 3, 5, 6, 8, 10, and 12 and also showed higher resistivity to IZO interconnection after the reliability test (under the conditions of 85° C./85%/500 hr) for IZO interconnection to those of the other Examples.

The conductive particle of Example 9 having a low compression deformation recovery rate of 5% showed higher resistivity after the reliability test (under the conditions of 85° C./85%/500 hr) for IZO interconnection to those of the conductive particles of Examples 1 to 3, 5, 6, 8, 10, and 12.

The conductive particle of Example 11 having a high compression deformation recovery rate of 80% showed higher resistivity after the reliability test (under the conditions of 85° C./85%/500 hr) for IZO interconnection to those of the conductive particles of Examples 1 to 3, 5, 6, 8, 10, and 12.

What is claimed is:

1. Conductive particles comprising:
   polymer fine particles, and
   a conductive layer formed on surfaces of the polymer fine particles,
   wherein an outermost surface shell of the conductive layer is a nickel-palladium alloy layer, and
   wherein a compressive elasticity modulus of the conductive particles at a compression deformation rate of 40% to 70% is 100 kgf/mm$^2$ to 1,000 kgf/mm$^2$, and a compression deformation recovery rate is 10% to 70%.

2. The conductive particles according to claim 1, wherein the nickel-palladium alloy layer has a thickness of 5 nm to 20 nm.

3. The conductive particles according to claim 1, wherein the nickel-palladium alloy layer is formed by carrying a palladium catalyst on the surfaces of the polymer fine particles and using a catalyst promoter.

4. The conductive particles according to claim 1, wherein the conductive layer includes a nickel plating layer which is formed on the surfaces of the polymer fine particles.

5. The conductive particles according to claim 1, wherein the conductive layer has a thickness of 50 nm to 150 nm.

6. The conductive particles according to claim 1, further comprising: protrusions each having a core made of at least any one of nickel, palladium, cobalt, and chromium.

7. The conductive particles according to claim 1, wherein the conductive particles are used for connecting an IZO substrate.

8. Anisotropic conductive film comprising:
   conductive particles, and
   a binder,
   wherein the conductive particles comprise polymer fine particles, and a conductive layer formed on surfaces of the polymer fine particles,
   wherein an outermost surface shell of the conductive layer is a nickel-palladium alloy layer,
   wherein a compressive elasticity modulus of the conductive particles at a compression deformation rate of 40% to 70% is 100 kgf/mm$^2$ to 1,000 kgf/mm$^2$, and a compression deformation recovery rate is 10% to 70%, and
   wherein the binder contains at least one of an epoxy resin and an acrylate resin.

9. The anisotropic conductive film according to claim 8, further comprising: at least one of a phenoxy resin, an unsaturated polyester resin, a saturated polyester resin and a urethane resin in an amount of 10% by mass to 80% by mass relative to the total amount of the anisotropic conductive film.

10. The anisotropic conductive film according to claim 9, further comprising: a latent curing agent which is activated under heating.

11. The anisotropic conductive film according to claim 9, further comprising: a latent curing agent which generates free radicals under heating.

12. The anisotropic conductive film according to claim 8, wherein when a curing rate of the anisotropic conductive film is 80% or higher, an elastic modulus thereof at a temperature of 40° C. or lower is 0.5 GPa or more, and a glass transition temperature thereof is 50° C. or higher.

13. A joined structure comprising:
    a first circuit member,
    a second circuit member disposed facing to the first circuit member, and
    an anisotropic conductive film disposed between the first circuit member and the second circuit member,
    wherein the anisotropic conductive film comprises:
    conductive particles, and
    a binder,
    wherein the conductive particles comprise polymer fine particles, and a conductive layer formed on surfaces of the polymer fine particles,
    wherein an outermost surface shell of the conductive layer is a nickel-palladium alloy layer,
    wherein a compressive elasticity modulus of the conductive particles at a compression deformation rate of 40% to 70% is 100 kgf/mm$^2$ to 1,000 kgf/mm$^2$, and a compression deformation recovery rate is 10% to 70%,
    wherein the binder contains at least one of an epoxy resin and an acrylate resin, and
    wherein an electrode in the first circuit member is connected to an electrode in the second circuit member via the conductive particles.

14. The joined structure according to claim 13, wherein at least one of the first circuit member and the second circuit member is an IZO substrate.

15. A joining method using an anisotropic conductive film, comprising:
    disposing an anisotropic conductive film between a first circuit member and a second circuit member,
    pressing the first circuit member against the second circuit member, and connecting an electrode in the first circuit member to an electrode in the second circuit member via the conductive particles,
wherein the anisotropic conductive film comprises:
conductive particles, and
a binder,
wherein the conductive particles comprise polymer fine particles, and a conductive layer formed on surfaces of the polymer fine particles,
wherein an outermost surface shell of the conductive layer is a nickel-palladium alloy layer,
wherein a compressive elasticity modulus of the conductive particles at a compression deformation rate of 40% to 70% is 100 kgf/mm$^2$ to 1,000 kgf/mm$^2$, and a compression deformation recovery rate is 10% to 70%, and
wherein the binder contains at least one of an epoxy resin and an acrylate resin.

16. The joining method according to claim 15, wherein at least one of the first circuit member and the second circuit member is an IZO substrate.

* * * * *